(12) United States Patent
Cartier et al.

(10) Patent No.: US 7,488,656 B2
(45) Date of Patent: Feb. 10, 2009

(54) REMOVAL OF CHARGED DEFECTS FROM METAL OXIDE-GATE STACKS

(75) Inventors: Eduard A. Cartier, New York, NY (US); Matthew W. Copel, Yorktown Heights, NY (US); Supratik Guha, Chappaqua, NY (US); Richard A. Haight, Mahopac, NY (US); Fenton R. McFeely, Ossining, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 11/119,310

(22) Filed: Apr. 29, 2005

(65) Prior Publication Data

US 2006/0246740 A1 Nov. 2, 2006

(51) Int. Cl.
*H01L 21/336* (2006.01)
(52) U.S. Cl. ................. 438/287; 438/142; 438/197; 438/584; 438/585; 438/591; 438/758; 438/778; 438/785
(58) Field of Classification Search ................. None
See application file for complete search history.

(56) References Cited

U.S. PATENT DOCUMENTS

| 6,204,203 | B1 * | 3/2001 | Narwankar et al. | ......... 438/785 |
| 6,379,994 | B1 * | 4/2002 | Sano et al. | ..................... 438/96 |
| 6,458,695 | B1 | 10/2002 | Lin et al. | ..................... 257/407 |
| 6,835,989 | B2 | 12/2004 | Lin et al. | ..................... 257/338 |
| 7,135,361 | B2 * | 11/2006 | Visokay et al. | ............... 438/197 |
| 2003/0160227 | A1 | 8/2003 | Misra et al. | .......... 257/E21.204 |
| 2003/0183939 | A1 * | 10/2003 | Kakamu et al. | ............. 257/762 |
| 2004/0132239 | A1 * | 7/2004 | Lin et al. | ..................... 438/199 |
| 2004/0132296 | A1 | 7/2004 | Lin et al. | ............. 257/E21.637 |

(Continued)

OTHER PUBLICATIONS

Schaeffer, J.K., et al., "Contributions to the effective work function of platinum on hafnium dioxide", Applied Physics Letters (2004), vol. 85, No. 10, pp. 1826-1828.

*Primary Examiner*—Andy Huynh
*Assistant Examiner*—Hoang-Quan T Ho
(74) *Attorney, Agent, or Firm*—Scully, Scott, Murphy & Presser, P.C.; Ido Tuchman, Esq.

(57) ABSTRACT

The present invention provides a method for removing charged defects from a material stack including a high k gate dielectric and a metal contact such that the final gate stack, which is useful in forming a pFET device, has a threshold voltage substantially within the silicon band gap and good carrier mobility. Specifically, the present invention provides a re-oxidation procedure that will restore the high k dielectric of a pFET device to its initial, low-defect state. It was unexpectedly determined that by exposing a material stack including a high k gate dielectric and a metal to dilute oxygen at low temperatures will substantially eliminate oxygen vacancies, resorting the device threshold to its proper value. Furthermore, it was determined that if dilute oxygen is used, it is possible to avoid undue oxidation of the underlying semiconductor substrate which would have a deleterious effect on the capacitance of the final metal-containing gate stack. The present invention also provides a semiconductor structure that includes at least one gate stack that has a threshold voltage within a control range and has good carrier mobility.

10 Claims, 13 Drawing Sheets

U.S. PATENT DOCUMENTS

2005/0124109 A1*  6/2005  Quevedo-Lopez et al. .. 438/240
2005/0130442 A1*  6/2005  Visokay et al. .............. 438/775
2005/0164445 A1*  7/2005  Lin et al. .................... 438/240
2005/0233598 A1*  10/2005  Jung et al. ................... 438/785
2005/0245019 A1*  11/2005  Luo et al. ................... 438/200

* cited by examiner

REMOVAL OF CHARGED DEFECTS FROM METAL OXIDE-GATE STACKS

FIELD OF THE INVENTION

The present invention relates to semiconductor device manufacturing, and more particularly to a method of fabricating a complementary metal oxide semiconductor (CMOS) structure in which the charged defects are substantially removed from a metal oxide gate stack. The present invention also relates to a semiconductor structure that includes at least one gate stack that has a threshold voltage within a control range and has good carrier mobility.

BACKGROUND OF THE INVENTION

As is known to those skilled in the semiconductor art, transistors are the main building blocks of integrated circuits (ICs). Modem ICs interconnect millions of densely configured transistors that perform a wide variety of functions. To achieve this densely packed configuration, the physical dimensions of the transistors are typically scaled down to the sub-micron regime. Generally, the transistors used in the sub-micron regime typically include a polysilicon gate. However, polysilicon gates may suffer device performance degradation due to a polysilicon depletion effect in which an electric field applied to a polysilicon gate removes carriers (holes in a p-type doped polysilicon, or electrons in an n-type doped polysilicon) so as to create a depletion of carriers in the area of the polysilicon gate near the underlying gate dielectric of the transistor. This depletion effect results in a reduction in the strength of the electric field at the surface of the CMOS device when a voltage is applied to the polysilicon gate electrode, which can have an adverse affect on the transistor performance.

One proposed way of improving the performance of sub-micron transistors is to use metal gates in place of conventional polysilicon gates. While replacing traditional polysilicon gates with metal or metal alloy gate electrodes eliminates the polysilicon depletion effect, there are still problems associated with the use of such metal gates. Another way of improving the performance of a CMOS device is to include a conductive oxide as a contact layer. In such instances, the conductive oxide controls the threshold voltage of the CMOS device rather than the conductive metal used as the metal gate.

One problem encountered with metal gates is that the carriers from the metal gate can diffuse into the underlying gate dielectric material, thus causing shorting of the device.

In addition to using metal gates as a replacement for polysilicon gates, there is much research ongoing that deals with replacing conventional dielectrics such as silicon dioxide or silicon oxynitride with a gate dielectric that has a high dielectric constant. These materials are known in the art as "high k" materials with the term "high k" denoting an insulating material whose dielectric constant is greater than 4.0, preferably greater than 7.0.

CMOS technology can gain scaling advantages through the use of high k gate dielectrics with metal gates. These new components would replace the conventional polySi/$SiO_2$ technology that is used today. However, difficulties have risen in implementing metal gate/high k technology, principally involving the threshold voltage (Vt) of the devices. This problem is particularly relevant in pFET devices.

CMOS processing inevitably requires high temperature (on the order of greater than 550° C.) steps to activate source/drain dopants, as well as reducing steps to passivate interfaces. It is commonly observed that after this processing, positive charge is induced in the dielectric that alters the threshold voltage of the device. The change in threshold voltage for a typical device gated with a p-type metal (with a workfunction near 5 eV) is 300-700 mV. In other words, the effective workfunction of the metal has moved from the silicon valence band to the middle of the silicon band gap. This would render a CMOS circuit including such a pFET device inoperable. During the high temperature processing, oxygen deficiencies have been created in the metal oxide. Schaeffer et al. "Contributions of the effective work function of platinum on hafnium dioxide", Applied Physics Letters, Vol. 85, No. 10, Sep. 6, 2004, pp.1826 discuss these as interfacial vacancies. The interfacial vacancies can also be referred to as charged defects. It is also possible that these charged defects are conventional bulk oxygen vacancies in the high k gate dielectric that are electrostatically attracted to the interface formed between the gate conductor and the gate dielectric.

In view of the above, there is a need for providing a method of fabricating CMOS structures including a gate stack comprising at least a high k gate dielectric from which the charged defects have been substantially removed from the gate stack.

SUMMARY OF THE INVENTION

The present invention provides a method for removing charged defects from a material stack, which is useful in forming a pFET device, including at least a high k gate dielectric and a metal contact such that the resultant metal-containing gate stack including said high k gate dielectric has a threshold voltage substantially within the silicon band gap and good carrier mobility. Specifically, the present invention provides a re-oxidation procedure that will restore the dielectric to its initial, low-defect state. The applicants have unexpectedly determined that by exposing a material stack including a high k gate dielectric and a metal contact to dilute oxygen at low temperatures will substantially eliminate oxygen vacancies, resorting the device threshold to its proper value. The 're-oxidation' process of the present invention is useful on material stacks that are intended for use as pFETs. No benefits are seen in NFET devices.

Furthermore, the applicants have determined that if dilute oxygen is used, it is possible to avoid undue oxidation of the underlying semiconductor substrate which would have a deleterious effect on the capacitance of the resultant metal-containing gate stack including the high k gate dielectric and metal contact.

One benefit of using the method of the present invention in which dilute oxygen and a low temperature re-oxidation procedure is used includes reduced interface growth between the semiconductor substrate and the high k gate dielectric. Another benefit of using the method of the present invention is that it is compatible with a broad range of gate metals. It is worth noting that in Schaeffer et al. mentioned above oxidation of Pt gates occurs at a temperature of about 500° C. Oxidation at 500° C. would react with many gate metals and render them non-conductive. Thus, to avoid this Schaeffer et al. uses a noble metal such as Pt that is highly resistant to oxidation. The use of noble metals such as Pt are, however, problematic since they suffer from adhesion problems and are thus not typically suitable as a complementary metal oxide semiconductor (CMOS) component.

In the present invention, dilute oxygen and low temperature is used during the re-oxidation of a material stack including at least a high k gate dielectric, a metal contact and a gate conductor therefore the method of the present invention is compatible with many types of metals including, for example, Re, Ru, W, Rh, TiN or TaN.

In some device architectures, it may be impractical to expose the FET to dilute oxygen. For example, extensive interconnect layers may limit diffusion of oxygen to the gate stack, preventing re-oxidation of the high k gate dielectric. In this circumstance, it becomes necessary to implement an oxygen reservoir that would be embedded in the device region and provide additional oxygen to the dielectric to stabilize the threshold voltage.

In broad terms, the present invention provides a method of re-oxidizing a high k gate dielectric of a material stack useful as a pFET to substantially remove charged defects therefrom, which comprises:

exposing a material stack including a gate dielectric having a dielectric constant of about 4.0 or greater (i.e., high k) to dilute oxygen at a temperature from about 250° C. to about 450° C. for a time period from about 1 minute to about 24 hours, said dilute oxygen has a partial pressure of about 100 Torr or less.

The present invention also relates to a semiconductor structure that comprises:

at least one metal-containing gate stack located on a surface of a semiconductor structure, said at least one-metal containing gate stack comprising a gate dielectric having a dielectric constant from about 4.0 or greater on said semiconductor substrate, a metal contact located on said gate dielectric, a metal barrier located on the metal contact and a gate conductor located on said metal barrier, said at least one metal-containing gate stack has an effective workfunction of greater than about 4.8 eV resulting in a threshold voltage that is within 0 to 300 mV of a CMOS device having a channel width of about 100 nm or greater, said CMOS device having a SiON/polySi gate stack.

The semiconductor structure of the present invention contemplates pFETs including a p-type gate conductor, which can be present on a substrate in conjunction with at least one NFET. In some embodiments, the present invention contemplates a semiconductor structure in which the NFET comprises a polySi gate conductor, and the pFET comprises a p-type metal.

Due to the thermal budget required to form the gate conductor of a gate stack, metal gates including an elemental metal, elemental metal alloy or elemental metal nitride are preferably used in the present invention since such metal gates can be formed at a low temperature (below 550°) as compared to polySi gates. The low temperature of formation of the metal gate conductor is preferred herein since it prevents the reversal of the benefits that are obtained by utilizing the inventive re-oxidation process.

It is noted that the contact metal used in the present invention sets the effective workfunction of the material stack. The gate conductor has no function in setting the effective workfunction and the threshold voltage. Instead, the function of the gate conductor is to provide a low resistive contact to the barrier layer and the contact metal. Since the effective workfunction of the material stack is determined by the metal contact, the re-oxidation method described herein alters that layer.

BRIEF DESCRIPTION OF THE DRAWINGS

FIG. 4A is a cross section including cut A-A'; FIG. 4B is a cross section at A-A'; and FIG. 4C is a top down view of the structure shown in FIG. 4A.

DETAILED DESCRIPTION OF THE INVENTION

Figure 1A:
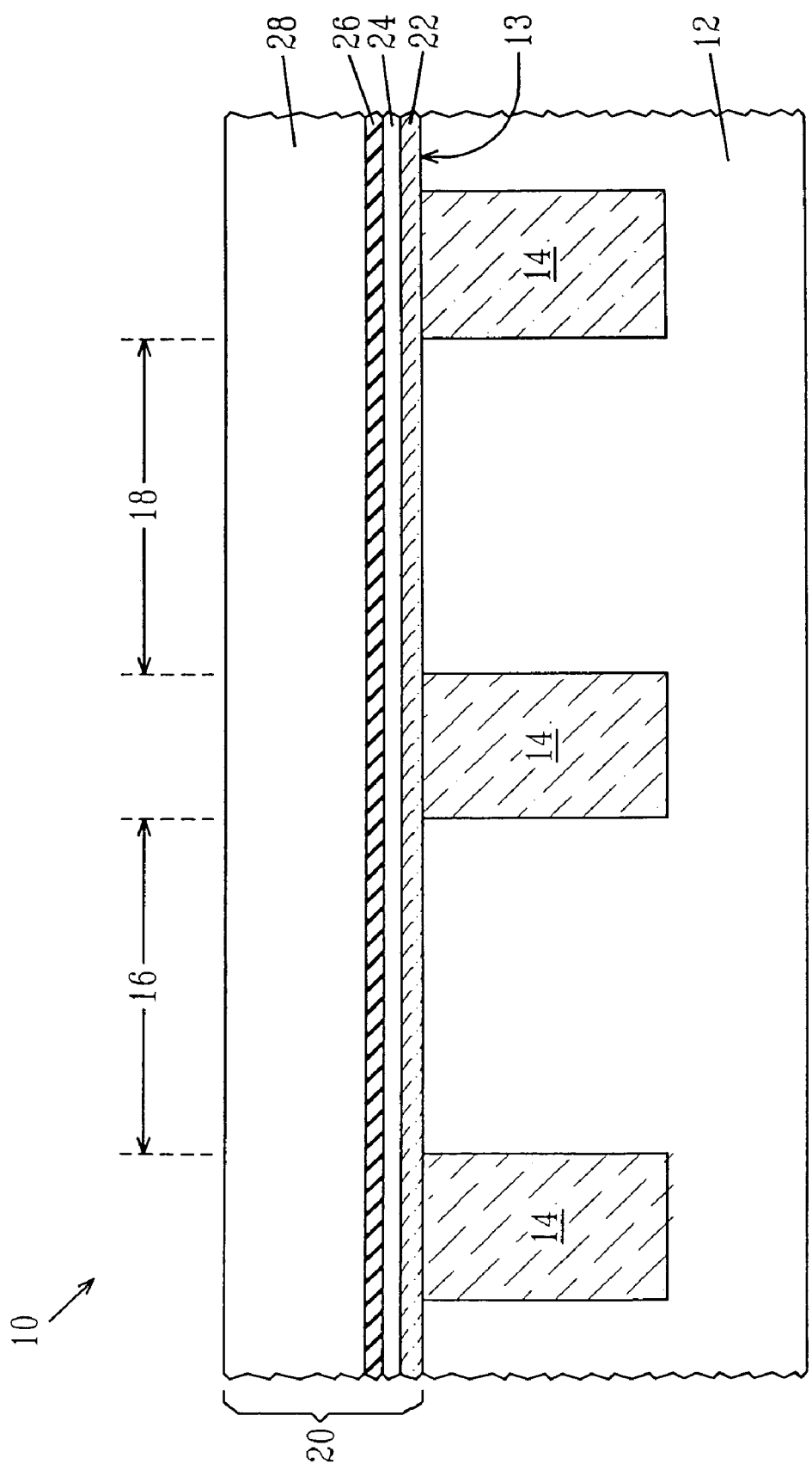
FIGS. 1A-1G are pictorial representations (through cross sectional views) illustrating the basic processing steps employed in a first embodiment of the present invention.

The present invention, which provides a method of substantially removing charged defects from a material stack including a high k gate dielectric and a metal contact, will now be described in greater detail by referring to the drawings that accompany the present application. It is noted that the drawings of the present application are provided for illustrative purposes and thus they are not drawn to scale.

Reference is first made to FIGS. 1A-1G which illustrate one of the embodiments of the present invention. It is emphasized that in the drawings of the present application, the semiconductor structure includes both an NFET and a pFET. Although such a structure is shown and described herein below, the present invention also contemplates semiconductor structures that include a pFET, a plurality of pFETs or a combination of a plurality of at least one pFET and at least one NFET. The re-oxidation process described above alters the effective workfunction of the metal contact within the pFET. The embodiment illustrated in FIGS. 1A-1G is for the case in which both the nFET and the pFET include a metal contact within the gate stacks that are of the same composition. In the illustrated embodiment, only the pFET will have a metal gate conductor, the nFET will have a polySi gate.

It is again worth emphasizing that the contact metal used in the present invention sets the effective workfunction of the material stack. As stated above, the gate conductor has no function in setting the effective workfunction and the threshold voltage. Instead, the function of the gate conductor is to provide a low resistive contact to the barrier layer and the contact metal. Since the effective workfunction of the material stack is determined by the metal contact, the re-oxidation method described herein alters that layer. Moreover, due to thermal budget constraints and to avoid reversing the benefits of the inventive re-oxidation step it is preferred in some embodiments of this invention to use a metal gate conductor instead of polySi.

FIG. 1A shows an initial structure 10 that is used in this embodiment of the present invention. The initial structure 10 includes a semiconductor substrate 12 that has isolation regions 14 located therein. The semiconductor substrate 12 includes an NFET device region 16 and a pFET device region 18 wherein the respective FETs will be formed. Atop the upper surface 13 of the semiconductor substrate 12 is a material stack 20 that includes (from bottom to top), a gate dielectric 22 having a dielectric constant of about 4.0 or greater, a metal contact 24, a metal barrier 26 and a layer of polySi 28.

The semiconductor substrate 12 shown in FIG. 1A comprises any semiconductor material including, for example, Si, Ge, SiGe, SiC, SiGeC, Ge, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or germanium-on-insulator (GOI).

In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, the NFET is typically formed on a (100) crystal surface, while the pFET is typically formed on a (110) crystal plane. The hybrid substrate can be formed by techniques that are well known in the art.

The semiconductor substrate 12 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells" and they are formed utilizing conventional ion implantation processes.

At least one isolation region 14 is then typically formed into the semiconductor substrate 12. The isolation region 14 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

After forming the at least one isolation region 14 within the semiconductor substrate 12, a gate dielectric 22 is formed on the surfaces of both the semiconductor substrate 12 and the isolation regions 14. The gate dielectric 22 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric 22 may also be formed utilizing any combination of the above processes.

The gate dielectric 22 is comprised of a high k metal oxide gate dielectric. The term "high k" is used herein to denote an insulator having a dielectric constant of greater than about 4.0, preferably greater than 7.0. Specifically, the high k gate dielectric 22 employed in the present invention includes, but not limited to: a metal oxide or a mixed metal oxide that may optionally include silicon or nitrogen. Some examples of high k gate dielectrics 22 that can be employed in the present invention include: $HfO_2$, $HfSiO_x$, $ZrO_2$, $ZrSiO_x$, $Al_2O_3$, $TiO_2$, $La_2O_3$, $SrTiO_3$, $LaAlO_3$, $CeO_2$, $Y_2O_3$ and multilayers thereof.

The physical thickness of the gate dielectric 22 may vary, but typically, the gate dielectric 22 has a thickness from about 0.5 to about 10 nm, with a thickness from about 0.5 to about 3 nm being more typical.

In some embodiments of the present invention (not shown herein), an interfacial layer comprising $SiO_2$ or SiON having a thickness from about 0.1 to about 1.5 nm is formed on the surface 13 of the substrate 12 prior to forming the gate dielectric 22. The optional interfacial layer is formed by one of the above mentioned techniques that were used in forming the gate dielectric, i.e., CVD, PECVD, ALD and the like. Thermal oxidation or chemical oxidation may also be used.

Figure 2A:
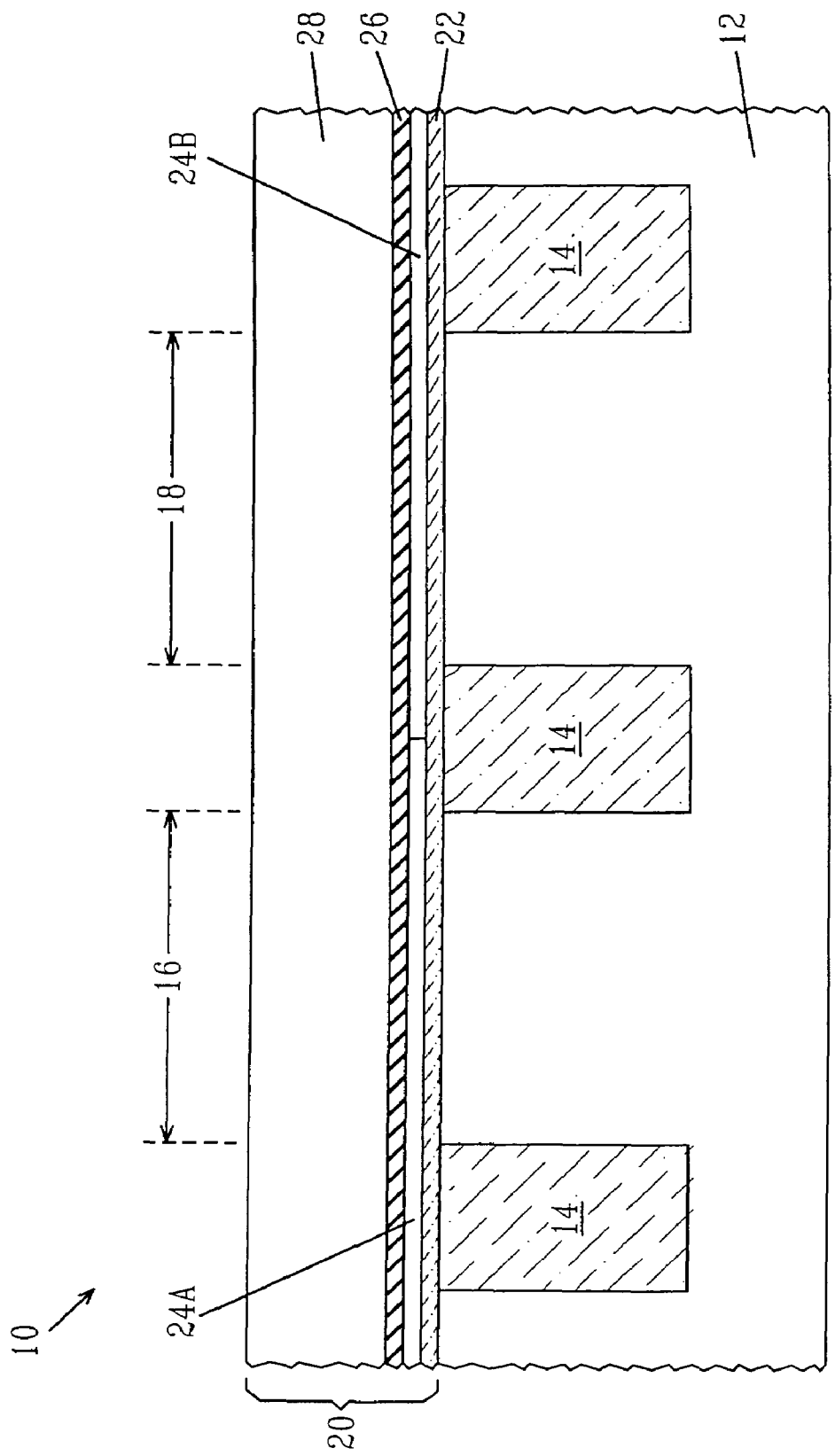
FIGS. 2A and 2B are pictorial representations (through cross sectional view) illustrating structures wherein the metal contacts of the NFET and the pFET are different materials.
Figure 2B:
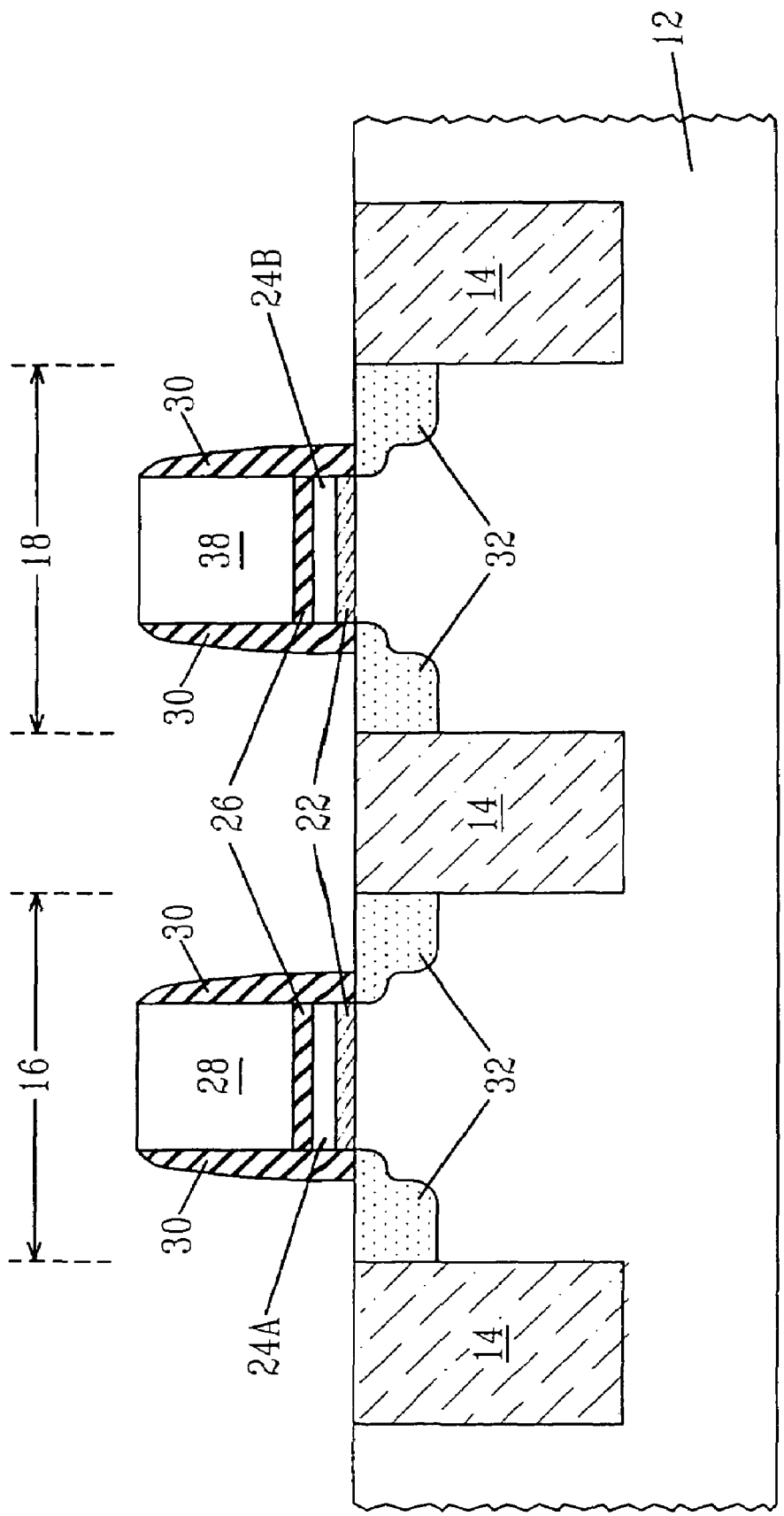

Next, the metal contact 24 is formed atop the gate dielectric 22 by utilizing a conventional deposition process including, CVD, PECVD, MOCVD, ALD, evaporation, reactive sputtering, chemical solution deposition and other like deposition processes. The metal contact 24 comprises at least one metal selected from Group IVB, VB, VI, VIIB and VIIIB of the Periodic Table of Elements. In some embodiments, the metal contact 24 may further include nitrogen or SiN. Illustrative examples of the metal contact 24 include, but are not limited to: Re, Rh, Ru, W, TiN, Hf, HfN, HfSiN, TaSiN, TaN or mulitilayers thereof. The metal contact 24 may comprise the same material as shown in this embodiment of the present invention, or it may comprise different materials in each of the different FET device regions as shown in FIGS. 2A-2B.

The thickness of the metal contact 24 may vary depending on the deposition process used and the material components of the metal contact 24. Typically, the metal contact 24 has a thickness from about 1 to about 20 nm, with a thickness from about 2 to about 10 nm being even more typically.

Since the effective workfunction is set by the metal contact 24, it may include a high workfunction elemental metal typically used for pFETs, or a low workfunction elemental metal typically used for nFETs. The term "high workfunction" is used throughout the present application to denote an elemental metal, metal nitride or metal silicon nitride having a workfunction of greater than 4.9 eV, preferably from about 5.0 to about 5.2 eV. Elemental metals whose workfunction would be characterized as 'high' and thus can be used in forming the pFET of the present invention include a metal selected from Group VIB, VIIB or VIII of the Periodic Table of Elements. Thus, the high workfunction elemental metal may comprise Cr, Mo, W, Mn, Tc, Re, Fe, Ru, Os, Co, Rh, Ir, Ni, Pd or Pt. In some embodiments, an oxide of Re can be used as the high workfunction material.

The term "low workfunction" is used throughout the present application to denote an elemental metal, metal nitride or metal silicon nitride having a workfunction of less than 4.2 eV, preferably from about 3.8 to about 4.1 eV. Elemental metals whose workfunction would be characterized as 'low' and thus can be used in forming the nFET of the present invention include a metal selected from Group IIIB, IVB or VB of the Periodic Table of Elements. Thus, the low workfunction elemental metal may comprise Sc, Y, La, Ti, Zr, Hf, V, Nb or Ta. Preferably, the low workfunction metal comprises Ti, Hf, Ta, Nb or V, with Ti being most preferred.

Atop the metal contact 24 is a metal barrier 26. The metal barrier 26 comprises SiN, TaSiN, HfSiN, other metal nitrides, amorphous metals or like materials. It is observed that the foregoing list of materials can function as an oxygen diffusion barrier layer. The oxygen diffusion barrier property of the aforementioned materials is not, however, the primary concern in the present invention. Instead, the metal barrier 26 is used in the present invention to prevent the reaction of the contact metal 24 with the gate material that lies atop the metal barrier 26. Since the metal barrier 26 prevents interaction (and interdiffusion) between the metal contact and the gate material, there is no significant alternation in the threshold voltage of the material stack of the present invention.

The metal barrier 26 is formed utilizing a conventional deposition process including CVD, PECVD, MOCVD, ALD, evaporation, reactive sputtering, chemical solution deposition and other like deposition processes. The thickness of the metal barrier 26 may vary depending on the deposition process used and the material components of the metal barrier 26. Typically, the metal barrier 26 has a thickness from about 1 to about 20 nm, with a thickness from about 2 to about 10 nm being even more typically.

The structure shown in FIG. 1A also includes a polysilicon (polySi) layer 28. The polysilicon layer 28 can be formed by a conventional deposition processes such as, for example, CVD, PECVD, sputtering, evaporation, atomic layer deposition and the like. The polysilicon layer 28 may be doped in-situ or following deposition, by ion implantation. Alternatively, the polysilicon layer 28 may be doped later in the process of the present invention.

The thickness of the polysilicon layer 28 may vary depending on the technique used in depositing the same. Typically, and for illustrative purposes, the polysilicon layer 28 has a thickness from about 10 to about 100 nm.

It is noted that the various material layers of material stack 20 can be formed using depositions in which the vacuum between each of the depositions is not broken. In some embodiments, the vacuum between any number of the deposition steps can be broken, without affecting the structure of the present application.

FIG. 2A shows an initial structure 10 that is used when two different metal contacts, 24A and 24B are used. The structure is formed utilizing the basic procedures described above in forming the structure shown in FIG. 1A except that block masks are used to provide the two different metal contacts 24A and 24B. In some embodiments, of the present invention that structure can be formed either with an underlap or overlap of the layers 24A and 24B over the isolation region 14. That is, there may be a small gap between the two layers 24A and 24B over the isolation region 14 or one layer may overlap the other. A structure including an underlap of layers 24A and 24B is typically preferred.

Figure 1B:
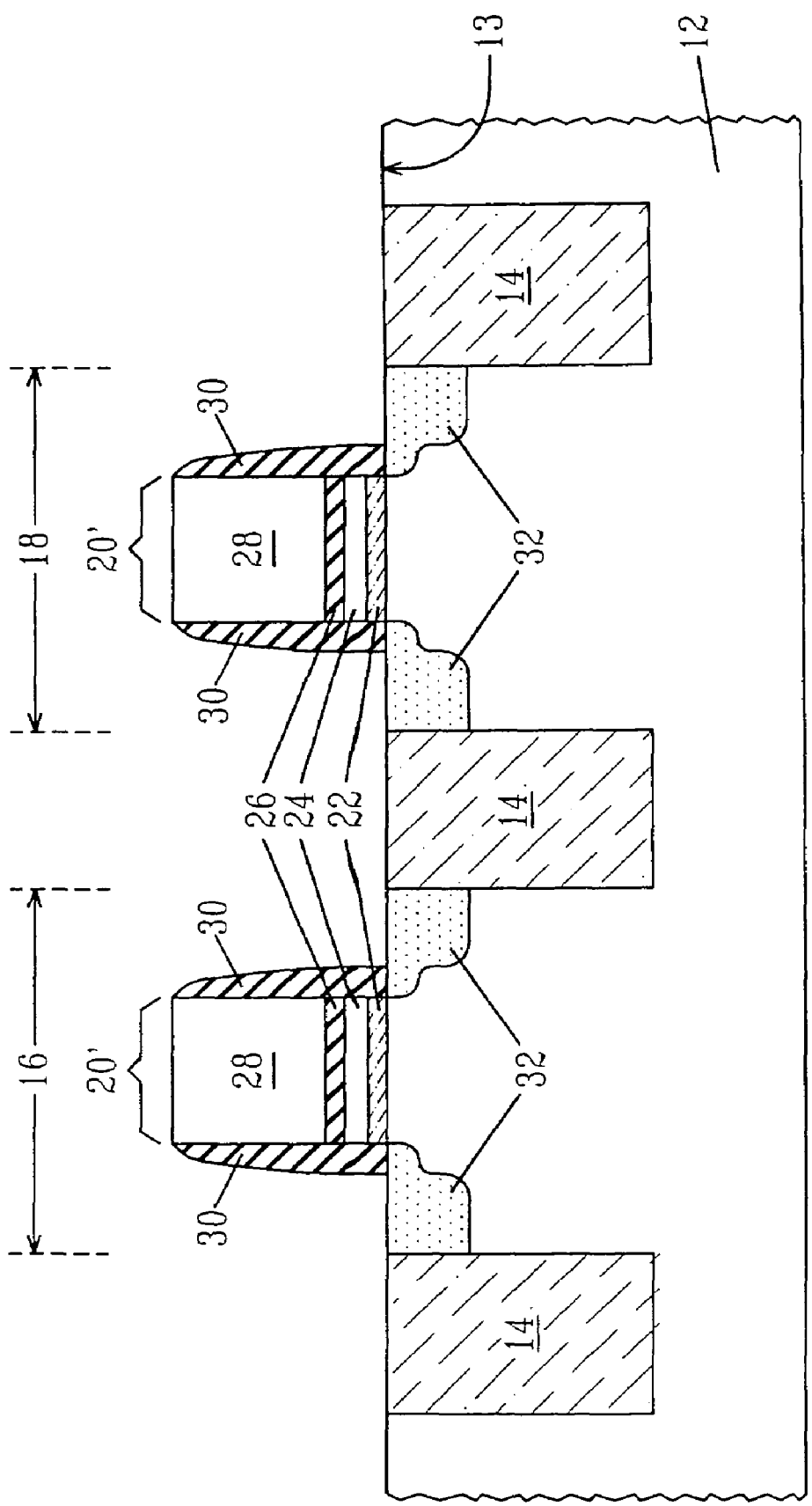

Following the formation of the initial structure 10 including the material stack 20 on the substrate 12, such as shown in either FIG. 1A of FIG. 2A, the material stack 20 (including the polysilicon layer 28, the metal barrier 26, the metal contact 24 and the high k gate dielectric 22) is patterned by lithography and etching. The lithographic step includes applying a photoresist (not shown) to the layer of polysilicon 28, exposing the photoresist to a desired pattern of radiation and developing the pattern using a conventional resist developer. The etching step includes the use of at least one of a dry etching step (including reactive-ion etching (RIE), ion beam etching (IBE), plasma etching or laser ablation), or a chemical wet etching process. A combination of the various etching techniques can also be used. As shown in FIG. 1B, a patterned material stack 20' is formed into both the nFET region 16 and the pFET region 18.

At least one spacer 30 is typically formed on exposed sidewalls of each patterned material stack 20'. The at least one spacer 30 is comprised of an insulator such as an oxide, nitride, oxynitride and/or any combination thereof. Preferably, the at least one spacer 30 is comprised of SiN. The at least one spacer 30 is formed by deposition and etching.

The width of the at least one spacer 30 must be sufficiently wide such that the source and drain silicide contacts (to be subsequently formed) do not encroach underneath the edges of the patterned material stack 20'. Typically, the source/drain silicide does not encroach underneath the edges of the patterned material stack 20' when the at least one spacer 30 has a width, as measured at the bottom, from about 20 to about 80 nm.

Source/drain diffusion regions 32 (see FIG. 1B) are then formed into the substrate 12. The source/drain diffusion regions 32 are formed utilizing ion implantation and an annealing step. The annealing step serves to activate the dopants that were implanted by the previous implant step. The conditions for the ion implantation and annealing are well known to those skilled in the art. The source/drain diffusion regions 32 may also include extension implant regions (as shown in the drawings), which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein. It is noted that doping of the polySi layer 28 can occur during the aforementioned implantations.

Figure 1C:
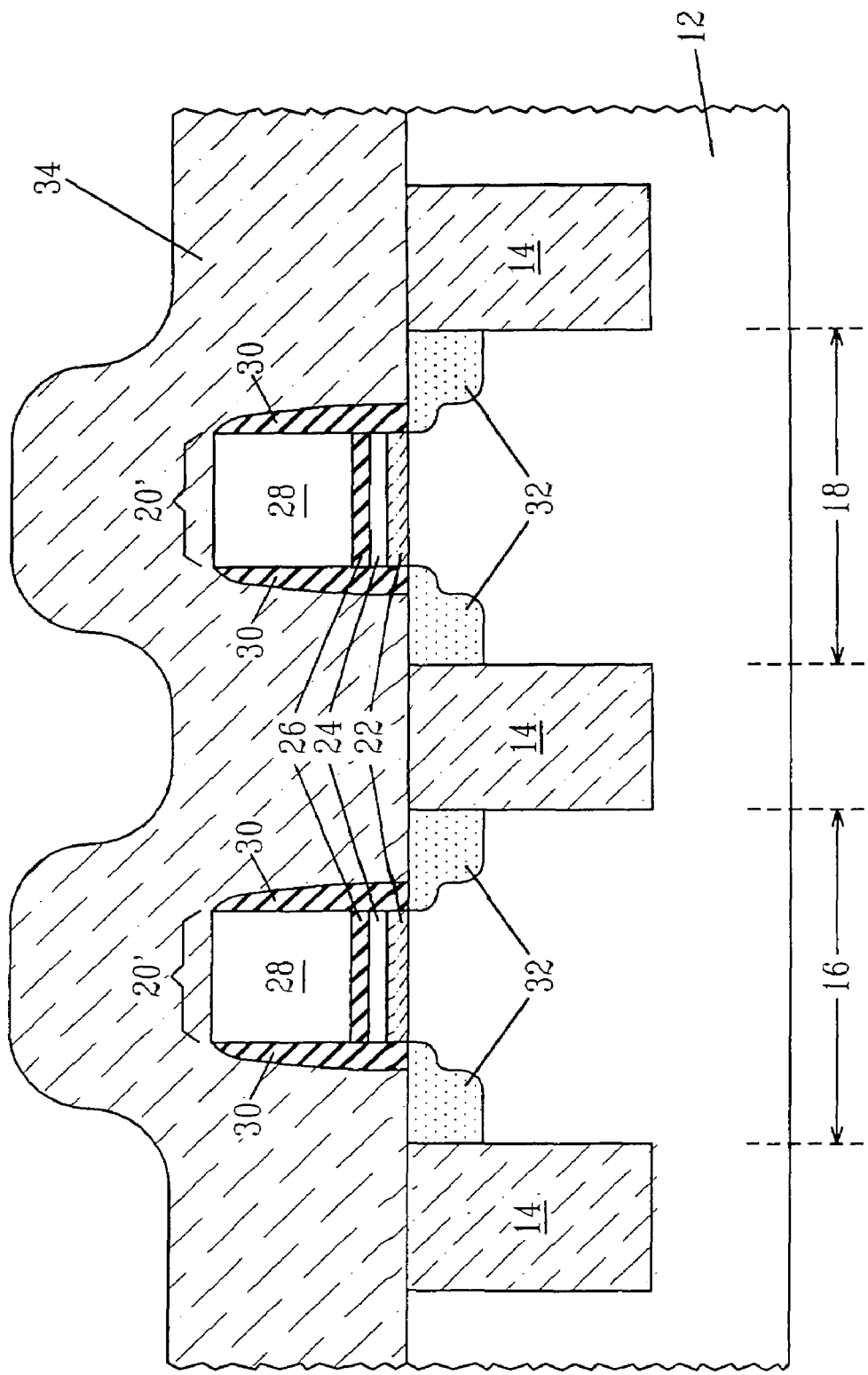

Next, and as shown in FIG. 1C, a dielectric material 34 is then formed over the entire structure including atop the patterned material stacks 20' utilizing a conventional deposition process. Specifically, the dielectric material 34 is formed by CVD or PECVD. The dielectric material 34 includes an oxide, a nitride, an oxynitride or multilayers thereof. Preferably the dielectric material 34 is an oxide such as $SiO_2$. The deposited dielectric material 34 has a thickness that is above the height of each of the patterned material stacks 20'.

After forming the dielectric material 34, the dielectric material 34 is planarized by chemical mechanical planarization (CMP) and/or grinding such that an upper surface thereof is planar with an upper surface of patterned polysilicon layer 28. A conventional mask material 36 is then formed on the NFET region 16 utilizing a conventional deposition process, followed by lithography and etching.

The exposed polysilicon 28 in the pFET region 18 not including mask material 36 is then removed utilizing an etching process, such as dry etching (i.e., RIE), wet etching or a combination of dry/wet etching, that selectively removes the exposed polysilicon from the patterned material stack 20' not including the mask material 36, stopping on the metal barrier 26. The resultant structure that is formed after these steps have been performed is shown, for example, in FIG. 1D.

At this point of the present invention, the inventive re-oxidizing step is performed to substantially remove charged defects from the patterned material stack 20' including the exposed metal barrier 26 in the pFET region 18. Specifically, the re-oxidizing step is performed by exposing the structure including the now exposed metal barrier 26 to dilute oxygen at a temperature from about 200° C. to about 450° C. for a time period from about 1 minute to about 24 hours. More typically the re-oxidizing step is performed in dilute oxygen at a temperature from about 300° C. to about 400° C. for a time period from about 10 minutes to about 60 minutes. The dilute oxygen includes an oxygen source such as $O_2$ that is diluted with an inert gas such as He, Ar, $N_2$, Ne, Kr, Xe or any combination thereof. The dilute oxygen employed in the present invention typically has an $O_2$ partial pressure of about 100 Torr or less, with an $O_2$ concentration from about 1 to about 100 parts per million (ppm) being even more typical.

It is noted that the above re-oxidizing step substantially removes charged defects from the high k gate dielectric 22. Moreover, the re-oxidizing step of the present application adjusts the threshold voltage within the pFET region 18 so that the threshold voltage is from about 0 V to about −0.3 V for a long channel device where the threshold voltage is not intentionally altered by channel implants/halos. The threshold voltage is within 300 mV of a conventional long channel device with a gate stack including SiON/polySi with identical substrate/well doping. It is noted that the re-oxidation step provides no significant benefits for nFETs.

After subjecting the structure to the inventive re-oxidizing step, the mask material 36 is removed from the surface of the planarized dielectric material 34. The mask material 36 is removed utilizing a conventional stripping process that is well known to those skilled in the art.

Figure 1D:
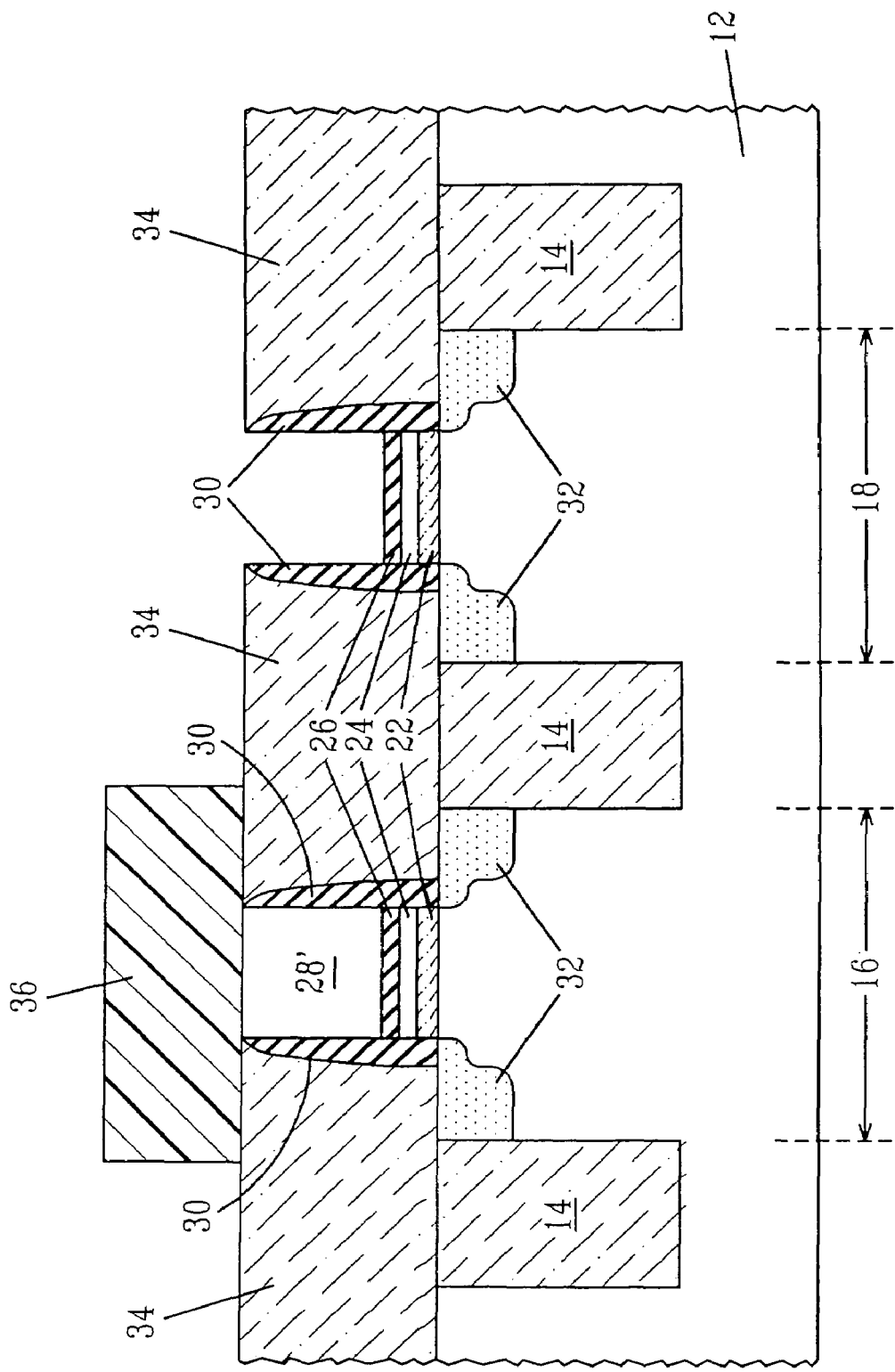
Figure 1E:
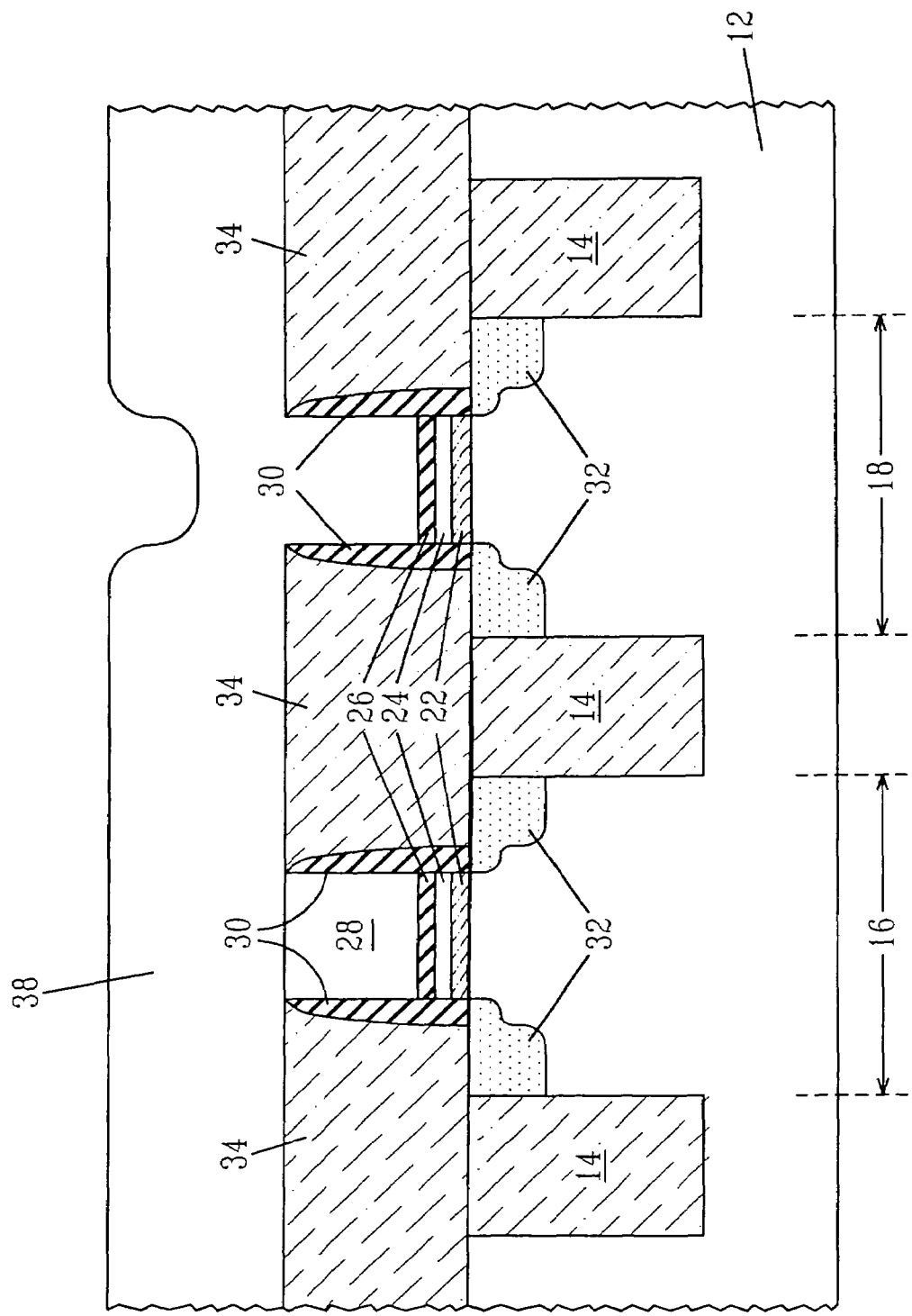
Figure 1F:
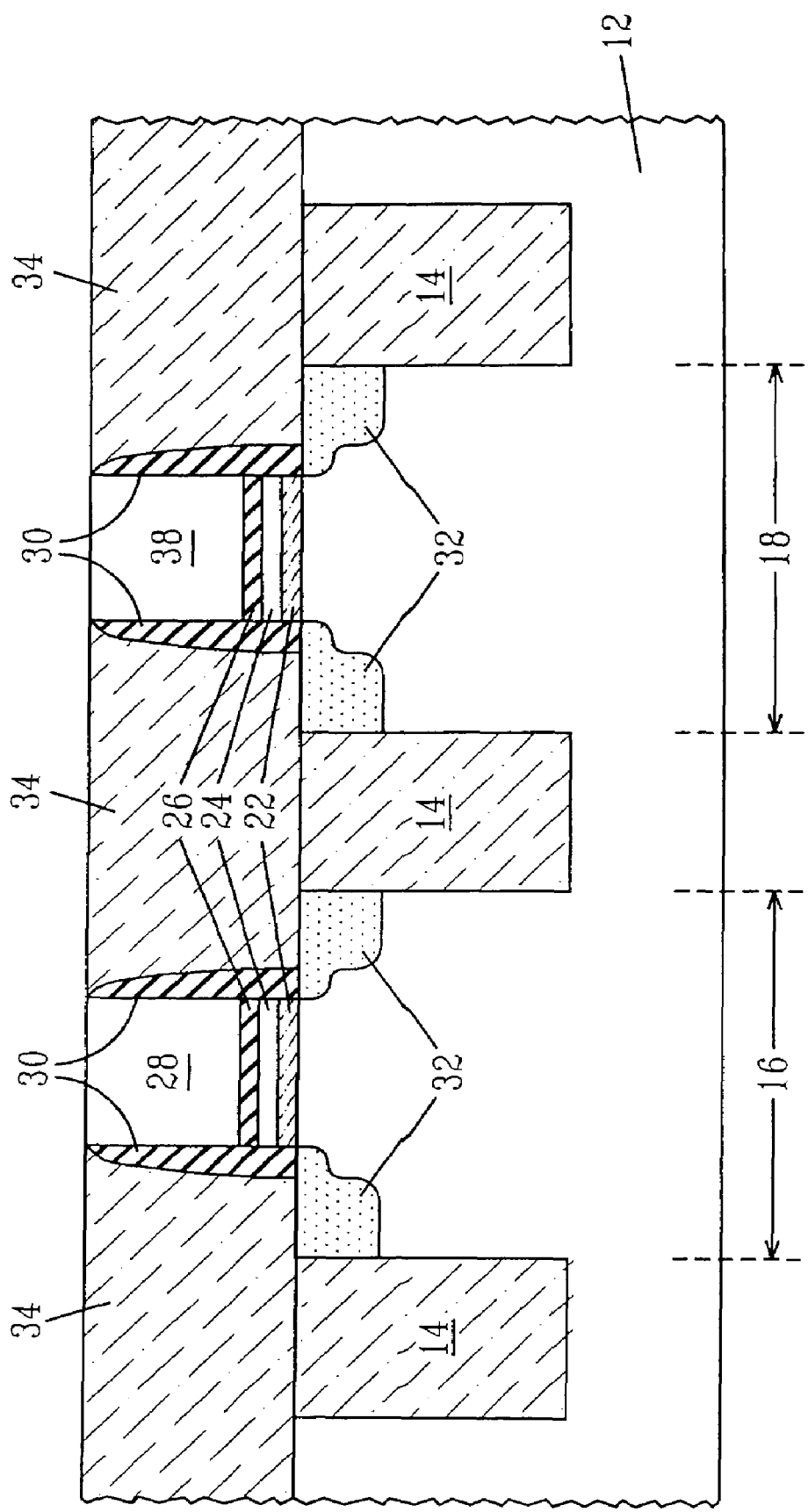

Next, and as shown in FIG. 1E, a metal gate conductor 38 is formed on the structure shown in FIG. 1D (minus the mask material 36). The metal gate conductor 38 is formed utilizing a conventional deposition process including, for example, CVD, PECVD, platting, reactive sputtering, MOCVD, ALD, evaporation, chemical solution deposition and other like deposition processes. It is noted that the deposition used in forming the metal gate conductor 38 should be performed at low temperatures (on the order of about 550° C. or less) to avoid introduction of oxygen vacancies into the high k gate dielectric. The thickness of the metal gate conductor 38 should be sufficient enough to fill in the opening in FET region where the polysilicon layer was removed.

The metal gate conductor 38 may comprise an elemental metal, an alloy (e.g., binary or ternary) of an elemental metal, a nitride of an elemental metal, a silicide of an elemental metal, a conductive oxide or any combination thereof. Examples of metal gate conductors 38 include, but are not limited to: TiN, TaN, W, Co, Ni, Cu, Cr, Mo and other like materials that include a low resistivity metal (on the order of about 50 microOhm*cm or less) and that can be deposited at low temperatures (less than about 550° C.) to avoid the reversibility of the aforementioned oxidation step.

After depositing the metal gate conductor 38, the structure shown in FIG. 1E is subjected to a planarization process such as CMP or grinding such that the metal conductor 38 has an upper surface that is substantially co-planar to the upper surface of the planarized dielectric material 34 as well as the gate conductor of the other FET region. The resultant structure formed after the planarization step has been performed is shown, for example, in FIG. 1F.

Figure 1G:
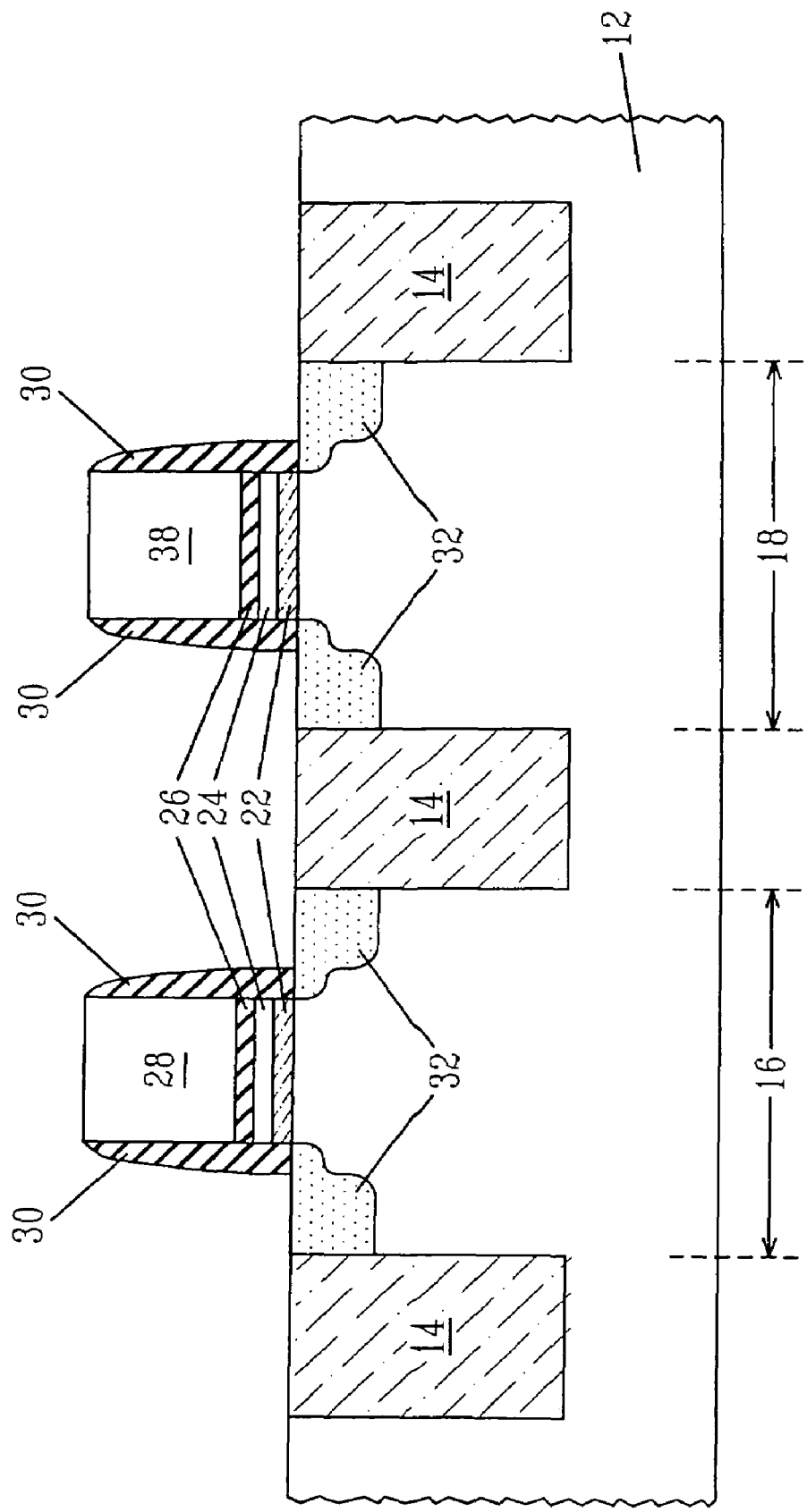

FIG. 1G shows the structure after removing the planarized dielectric material 34 from the structure. The removal of the planarized dielectric material 34 is achieved utilizing a conventional etch back process in which an etchant that is highly selective for removing the dielectric material 34 from the structure is employed. For example, the etch back process may include hot phosphoric acid which selectively removes oxides.

FIG. 2B shows the structure that is formed using the initial structure shown in FIG. 2A and the above-mentioned processing steps. The structure shown in FIG. 2B includes two different type of contact metals, while in FIG. 1G a single contact metal is used. The procedure described in the first embodiment can be performed on the structure shown in FIG. 2B to replace polysilicon in at least one of the patterned material stacks with a metal gate conductor.

Figure 3:
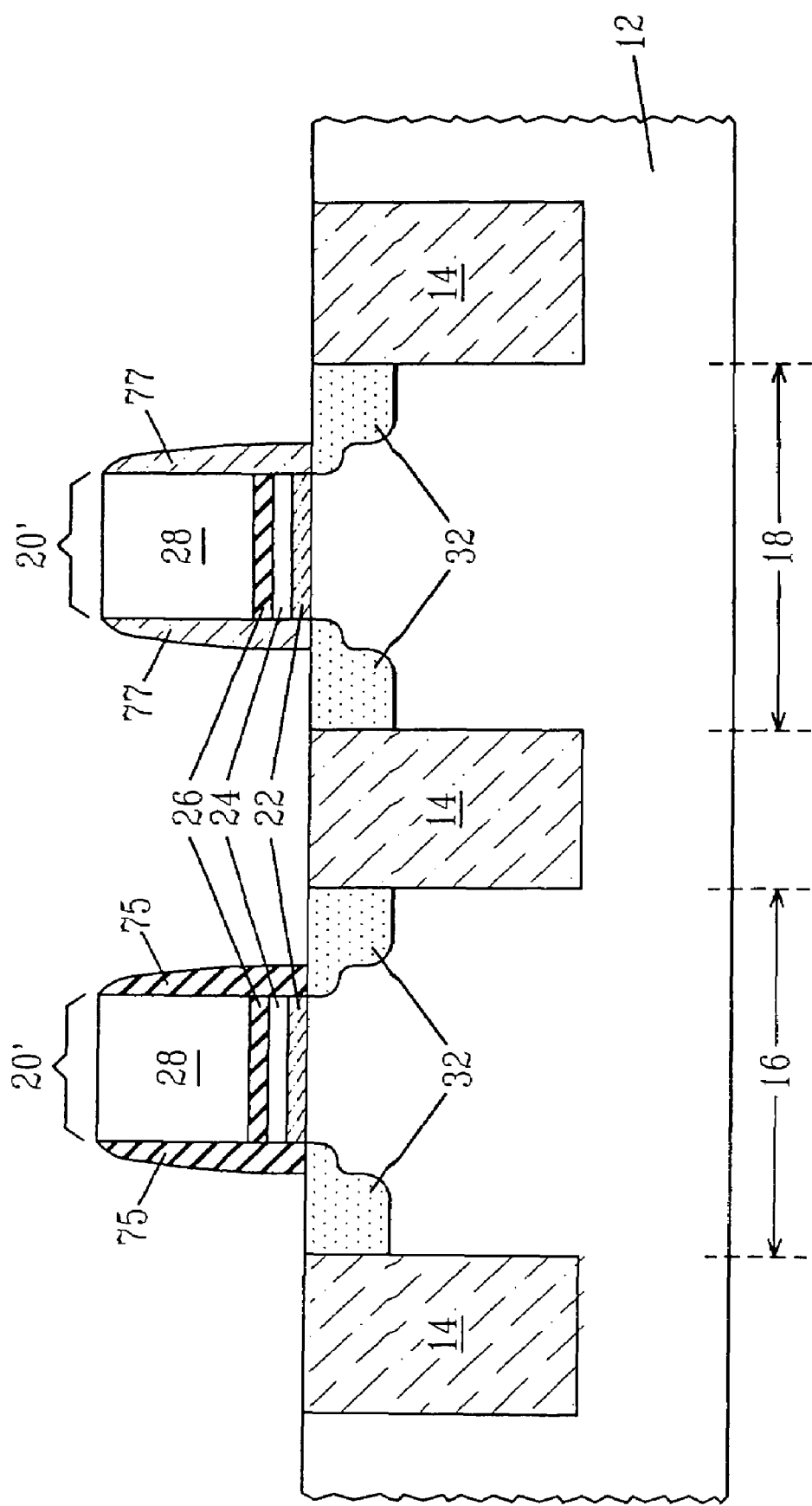
FIG. 3 is a pictorial representation (through a cross sectional view) illustrating another technique that can be used in the present invention to introduce dilute oxygen into a high k gate dielectric.

Reference is now made to FIG. 3 which is a pictorial representation (through a cross sectional view) illustrating another technique that can be used in the present invention to introduce dilute oxygen into a high k gate dielectric. In this embodiment of the present invention, the processing steps used in forming the structure shown in FIG. 1B are first performed except that different spacers are formed on the vertical sidewalls of the patterned material stacks 20'. When the re-oxidation is to occur in the pFET region 18, the NFET region receives oxygen blocking spacers 75, while the pFET region receives oxygen transparent spacers 77. An example of an oxygen blocking spacer is SiN, while $SiO_2$ can be used as the oxygen transparent spacer. The re-oxidizing process described above can be performed after spacer formation and then the processing steps described above for FIGS. 1C-1G can be performed.

In some embodiments of the present invention, no spacer is present on the material stack used in forming the pFET during the re-oxidation process; spacers can be formed after re-oxidation. When oxygen transparent spacers are present in the pFET region, they can be removed from the structure and replaced with an oxygen blocking spacer after the re-oxidation process.

Figure 4A:
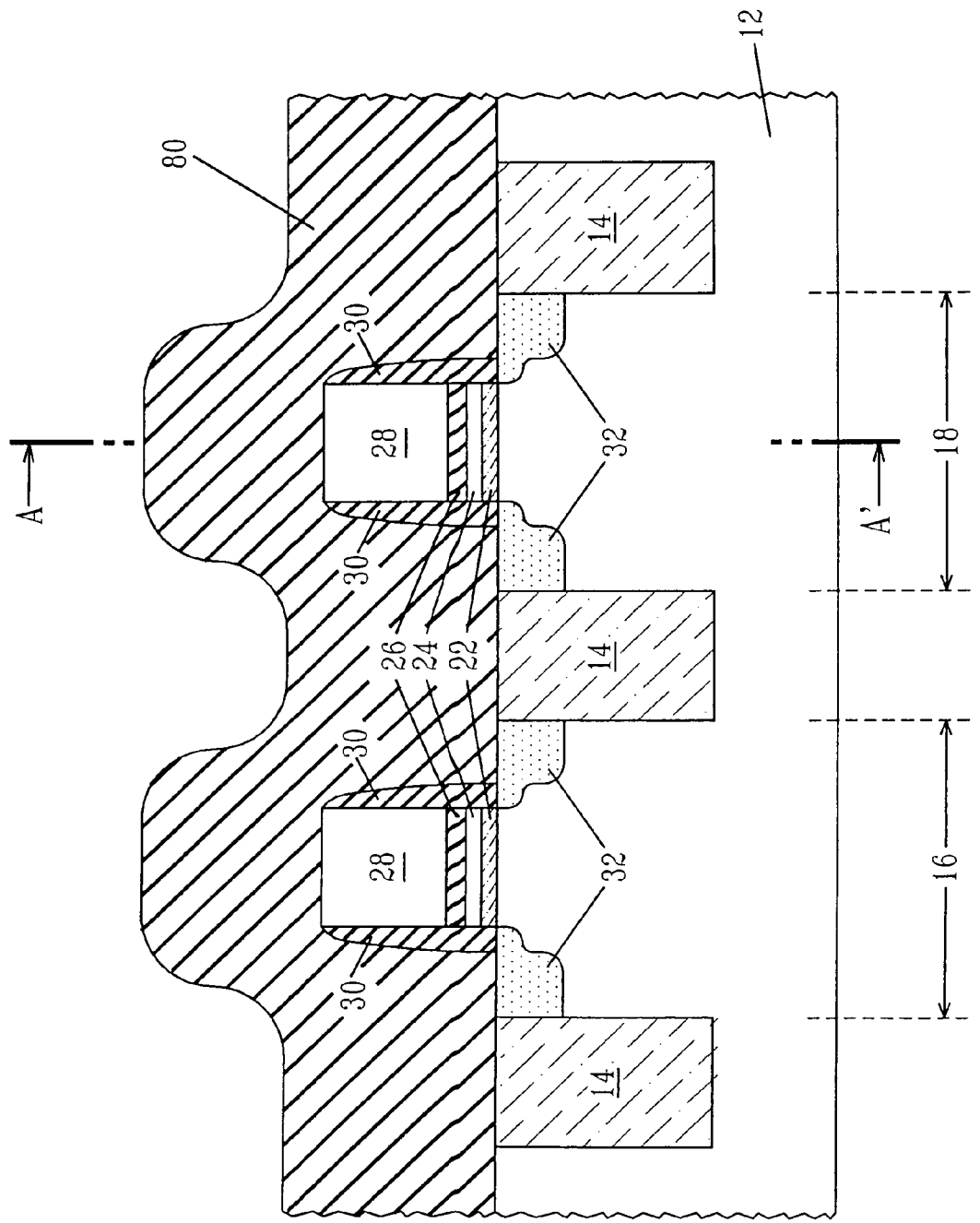
FIGS. 4A-4C are pictorial representations (through different views) showing yet another technique that can be used in the present invention to introduce dilute oxygen into a high k gate dielectric.
Figure 4B:
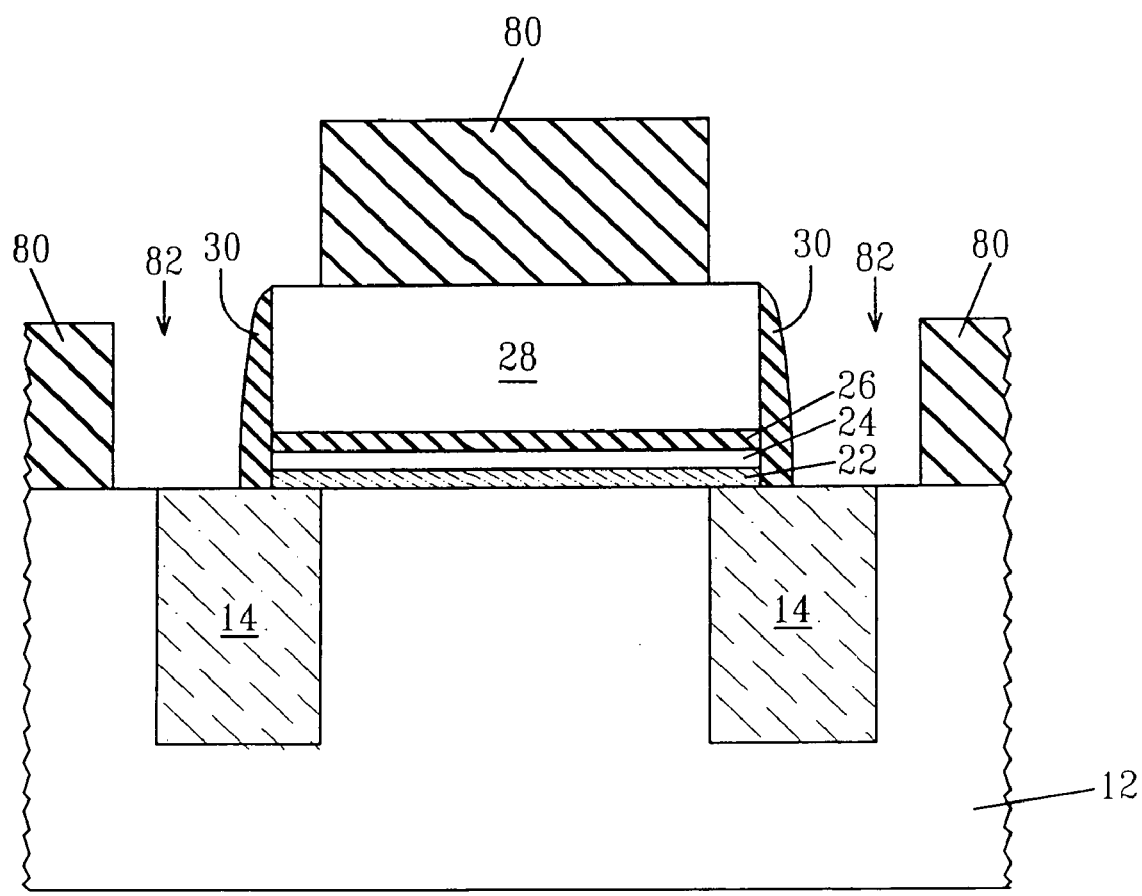
Figure 4C:
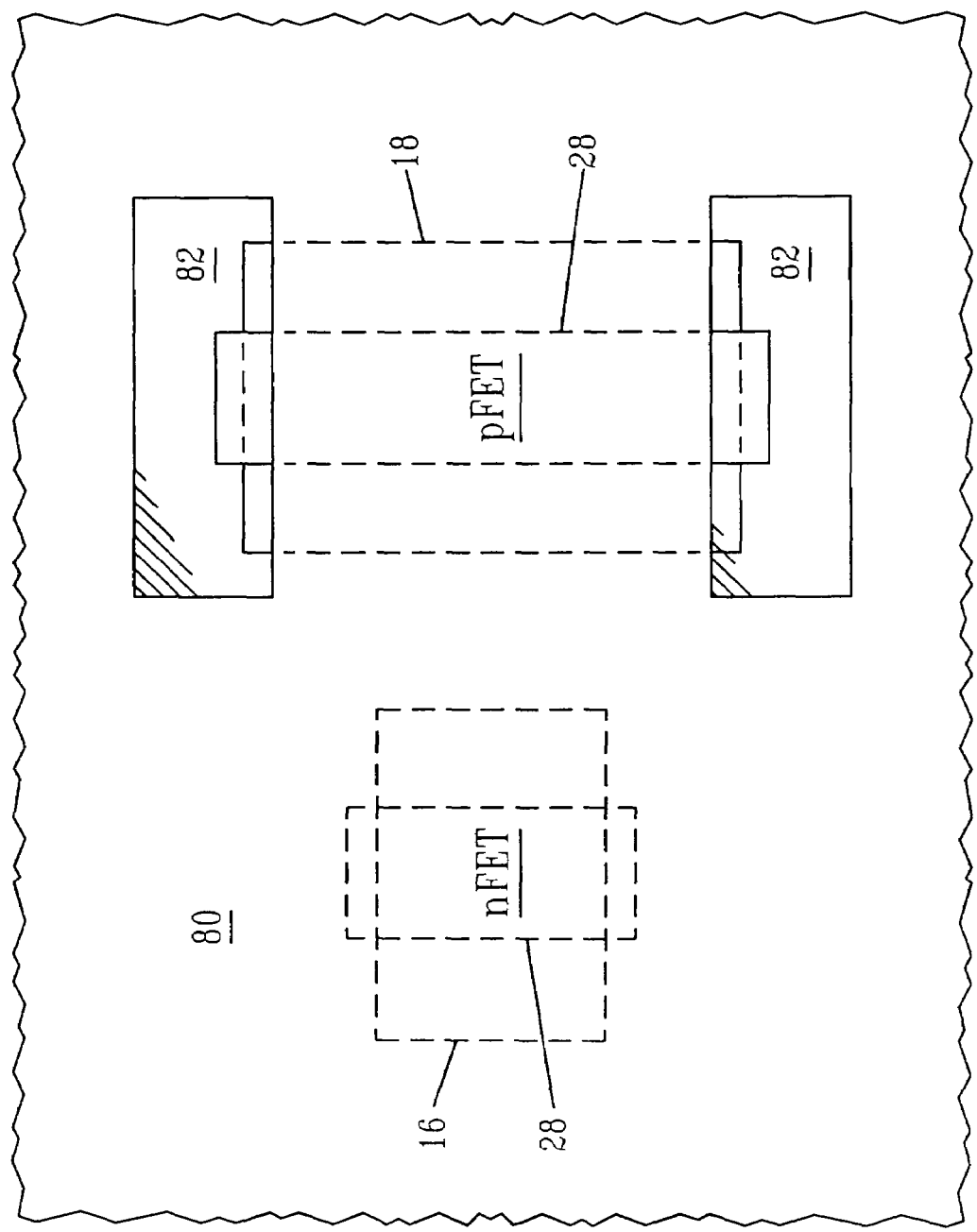

FIGS. 4A-4C are pictorial representations (through different views) showing yet another technique that can be used in the present invention to introduce dilute oxygen into a high k gate dielectric. FIG. 4A is a cross section including cut A-A'; FIG. 4B is a cross section at A-A'; and FIG. 4C is a top down view of the structure shown in FIG. 4A.

This embodiment of the present invention includes the basic processing steps shown for FIGS. 1A-1B. After performing these steps, a barrier layer 80 comprising an opening 82 is formed by deposition, lithography and etching. See FIGS. 4A and 4B. The barrier layer 80 includes any material that is resistant to oxygen diffusion. An example of such a material is SiN. As shown in FIG. 4B, the opening 82 exposing a portion of the trench isolation regions that are adjacent to pFET region 18. The re-oxidizing step described above can be performed in which the dilute oxygen enters the structure through the opening 82 using the isolation regions 14 as a pathway to introduce the dilute oxygen into the gate dielectric.

One of the key advantages of the inventive method over the prior art replacement gate structures is that in the prior art replacement gate structure, conventional NFET and pFET are built by methods in which $SiO_2$ is typically used as the gate insulator, In the prior art replacement gate structures, the poly-Si and the gate insulator are both removed from the nFET, the pFET or both device types. The removal of the full gate stack down to the substrate permits backfilling of the gate trenches with a high k/metal gate stack with arbitrary layer sequence. However, the fact that the gate etch stops on the substrate, some lateral oxidation may occur and alter the previously optimized design of the device. Also, the deposition of the gate dielectric and the contact layer in a narrow trench as for short channel devices poses difficulties.

The inventive method of Vt adjustment by top down oxidation does not touch the core of the pFET device, as the devices remain buried underneath the metal barrier layer and are not altered by the poly-Si removal.

The inventive method leads to a structure containing at least a pFET that can be easily distinguished from structures made by prior art replacement gate methods. In the replacement gate structure, the high k dielectric (and the contact layer and the barrier layer, if used) will wrap the inside of the gate trench. This can be seen by high resolution TEM imaging. In the inventive structure, the high k gate dielectric, the metal contact and the metal barrier layer are confined to the bottom of the trench, as they are formed early and are patterned by the gate etch. The inventive structure also differs from a conventional poly-Si CMOS structure, as the gate conductor is different from poly-Si. If poly-Si were used for back filling, the structure could not be distinguished from the conventional CMOS structure. However, the use of poly-Si would defeat the purpose of the inventive method, as the Vt would return to the undesirable position during the required high temperature activation anneal, which has caused the unfavorable Vt in the first place.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of re-oxidizing a high k gate dielectric of a material stack useful as a pFET to substantially remove charged defects therefrom comprising:

exposing a material stack including a gate dielectric having a dielectric constant of about 4.0 or greater to dilute oxygen at a temperature from about 250° C. to about 450° C. for a time period from about 1 minute to about 24 hours, said dilute oxygen has a partial pressure of 100 Torr or less.

2. The method of claim 1 wherein said temperature is from about 300° C. to about 400° C. and said time period is from about 10 to about 60 minutes.

3. The method of claim 1 wherein said dilute oxygen has a concentration from about 1 to about 100 ppm.

4. The method of claim 1 wherein said dilute oxygen includes an oxygen source that is diluted with an inert gas.

5. The method of claim 1 wherein said exposing to dilute oxygen is employed as a step in a replacement gate process for fabricating a pFET device.

6. The method of claim 5 wherein said replacement gate process includes providing at least one patterned material stack including said gate dielectric, a metal contact, a metal barrier and polysilicon on a surface of a semiconductor substrate; forming a planarized dielectric on said semiconductor substrate including atop said at least one patterned gate stack; removing the polysilicon from said at least one patterned material stack to expose the metal barrier, and then performing said exposing step.

7. The method of claim 1 wherein said exposing to dilute oxygen is performed on a structure that includes at least one patterned material stack including said gate dielectric, a metal contact, a metal barrier and polysilicon on a surface of a semiconductor substrate, said at least one patterned material stack including at least one spacer that is transparent to oxygen or no spacers.

8. The method of claim 7 further comprising at least one other patterned material stack that includes at least one spacer that is oxygen blocking.

9. The method of claim 1 wherein said exposing to dilute oxygen is performed on a structure including a barrier material that includes at least one opening that is located on a surface of a semiconductor substrate that includes at least one isolation region as well as at least one patterned material stack including said gate dielectric, a metal contact, a metal barrier and polysilicon on said substrate, whereby said dilute oxygen enters via the opening using the at least one isolation region as an oxygen pathway.

10. A method of re-oxidizing a high k gate dielectric of a material stack useful as a pFET to substantially remove charged defects therefrom comprising:

exposing a material stack including an oxygen diffusion barrier layer covering a gate dielectric having a dielectric constant of about 4.0 or greater to dilute oxygen at a temperature from about 250° C. to about 450° C. for a time period from about 1 minute to about 24 hours, said dilute oxygen has a partial pressure of 100 Torr or less.

* * * * *